(12) United States Patent
Becker et al.

(10) Patent No.: US 9,845,202 B2
(45) Date of Patent: Dec. 19, 2017

(54) METHOD AND DEVICE FOR STRINGING SUBSTRATES TOGETHER IN COATING SYSTEMS

(71) Applicant: SINGULUS TECHNOLOGIES AG, Kahl am Main (DE)

(72) Inventors: Wolfgang Becker, Schaafheim (DE); Edgar Rüth, Kahl am Main (DE); Jochen Heilingbrunner, Hanau (DE)

(73) Assignee: Singulus Technologies AG, Kahl am Main (DE)

( * ) Notice: Subject to any disclaimer, the term of this patent is extended or adjusted under 35 U.S.C. 154(b) by 0 days.

(21) Appl. No.: 14/880,364

(22) Filed: Oct. 12, 2015

(65) Prior Publication Data

US 2016/0325941 A1     Nov. 10, 2016

(30) Foreign Application Priority Data

Nov. 3, 2014  (DE) .................. 10 2014 222 382

(51) Int. Cl.
*B65G 43/10* (2006.01)
*B65G 43/08* (2006.01)
(Continued)

(52) U.S. Cl.
CPC ............. *B65G 43/10* (2013.01); *B65G 43/08* (2013.01); *B65G 47/261* (2013.01); *C23C 16/00* (2013.01);
(Continued)

(58) Field of Classification Search
CPC ......... H01L 21/67253; H01L 21/67276; H01L 21/67706; B65G 43/08; B65G 43/10;
(Continued)

(56) References Cited

U.S. PATENT DOCUMENTS

| 8,028,817 | B2 | 10/2011 | Itoh et al. | |
| 2001/0027909 | A1* | 10/2001 | Itoh ...................... | B65G 13/075 |
| | | | | 198/788 |

(Continued)

FOREIGN PATENT DOCUMENTS

| DE | 10 2009 050 328 A1 | 4/2010 |
| DE | 10 2010 031 245 A1 | 1/2012 |

*Primary Examiner* — Mark A Deuble
(74) *Attorney, Agent, or Firm* — Ohlandt, Greeley, Ruggiero & Perle, L.L.P.

(57) ABSTRACT

A method and a device for stringing together objects in transport systems, preferably in coating systems, for adjusting the distance between two objects, preferably substrates or substrate holders, being arranged one behind the other, wherein the front object moves at a process speed $v_p$ in the transport system and the rear object is at an undefined distance from the front object. The method comprises the following steps: (a) accelerating the rear substrate to an initial speed $v_x > v_p$; (b) detecting an increase in the driving torque when the rear substrate moves against the front substrate; (c) delaying the rear substrate by a predetermined value in order to establish a predetermined distance $a_p$ from the front substrate; and (d) adjusting the speed of the rear substrate to the process speed $v_p$.

7 Claims, 3 Drawing Sheets

(51) Int. Cl.
*C23C 16/00* (2006.01)
*B65G 47/26* (2006.01)
*H01L 21/67* (2006.01)
*H01L 21/677* (2006.01)

(52) U.S. Cl.
CPC .. *H01L 21/67253* (2013.01); *H01L 21/67276* (2013.01); *H01L 21/67706* (2013.01); *B65G 2203/042* (2013.01); *B65G 2811/0631* (2013.01); *B65G 2811/0673* (2013.01)

(58) Field of Classification Search
CPC ...... B65G 2203/042; B65G 2811/0631; B65G 2811/0673; B65G 43/04; B65G 47/261; B65G 47/31; C23C 16/00
USPC ..... 198/780–784, 459.8, 460.1, 462.1, 462.3
See application file for complete search history.

(56) References Cited

U.S. PATENT DOCUMENTS

| | | | |
|---|---|---|---|
| 2003/0042115 A1* | 3/2003 | Yamashita | H01L 21/67706 198/618 |
| 2004/0134755 A1* | 7/2004 | Sticht | B65G 43/10 198/465.2 |
| 2010/0108472 A1* | 5/2010 | Chuang | B65G 47/261 198/783 |
| 2013/0213768 A1* | 8/2013 | Yokoya | B65G 43/10 198/462.1 |
| 2014/0156061 A1* | 6/2014 | Neiser | B65G 47/268 700/223 |
| 2014/0277698 A1* | 9/2014 | Combs | B65G 43/10 700/230 |
| 2016/0172225 A1* | 6/2016 | Morikawa | H01L 21/67772 73/865.8 |

* cited by examiner

METHOD AND DEVICE FOR STRINGING SUBSTRATES TOGETHER IN COATING SYSTEMS

BACKGROUND

1. Field of the Disclosure

The present disclosure generally relates to the field of transport systems, in particular of coating systems, in which objects, in particular substrates such as semiconductor wafers, solar cells, etc. and/or substrate carriers should be strung together.

2. Discussion of the Background Art

When coating flat objects such as, e.g., substrates, it is necessary that the objects on the one hand remain statically in a specific position in a coating system for a certain time, for example for heating them. On the other hand, it is necessary that the objects are moved past the coating source at a constant speed. In connection with the movement past the coating source it is desirable that the objects pass the coating source with as little gaps as possible between them, so that as little as possible of the material to be applied does not reach the object and enters the coating chamber.

The stringing together of the objects, i.e. the lining of the objects one behind the other, is often controlled by sensors which are arranged at corresponding positions and should serve for detecting an approaching object. In this regard, the approximate speed and the approximate time are additionally required for determining or influencing the distance or gap between the preceding object and the successive object. In order to prevent the objects from colliding, a certain safety distance must be maintained. However, in particular in coating systems it is desired, as mentioned above, to keep this distance as small as possible.

When using carriers for the objects, the distance can be adjusted reliably, e.g., by a connection (groove and tongue at the carriers) between the carriers moving one behind the other. However, this principle functions only if specific carriers are used. Hence, it is not possible to apply this principle to objects moving through such a system without carriers.

In view of the prior art, reference is further made to DE 10 2009 050 328 A1 and DE 10 2010 031 245 A1.

The solutions available so far are not reliable and allow only relatively large distances between the objects.

SUMMARY

It is the object underlying the present disclosure to provide a method and a device for establishing a reliably defined and as small as possible distance between objects in a transport system, in particular a coating system. Moreover, it is an object of the disclosure to avoid damage to the objects. Hence, a minimum undesired coating of the inner walls of the coating chamber and a maximum material yield should be guaranteed.

The present disclosure offers a method for stringing objects together in transport systems, preferably in coating systems, for adjusting the distance between two objects, preferably substrates or substrate holders, being arranged one behind the other, wherein the front object moves at a process speed $v_p$ in the transport system and the rear object is at an undefined distance from the front object, wherein the method comprises the following steps: Accelerating the rear substrate to an initial speed $v_x > v_p$; detecting an increase in the driving torque when the rear substrate moves against the front substrate; delaying the rear substrate by a predetermined value in order to establish a predetermining distance $a_p$ from the front substrate; and adjusting the speed of the rear substrate to the process speed $v_p$.

In accordance with an aspect of the present disclosure, the method further comprises additionally the following steps after the step of accelerating to an initial speed $v_x$ and before the step of detecting an increase in the driving torque: Detecting a first distance $a_1$ between the front object and the rear object, and throttling the initial speed $v_x$ of the rear object to a second speed $v_{x-m}$, wherein $v_x > v_{x-m} > v_p$.

In accordance with a further aspect of the present disclosure, the speeds of the objects can be adjusted independently of one another by means of at least two successively arranged drive units preferably comprising a motor, a drive amplifier and an encoder and each driving multiple drive elements, preferably rolls.

The front drive unit can adjust the speed of the front object, and the rear drive unit can adjust the speed of the rear object.

The first distance $a_1$ can be detected, e.g., by means of position sensors.

In accordance with a further aspect of the present disclosure, the increase in the driving torque when the rear object moves against the front object can be determined by means of a motor with a drive amplifier and an encoder.

The distance $a_p$ should be smaller than the distance $a_1$.

In accordance with a further aspect, the present disclosure provides a device for stringing objects together in transport systems, preferably in coating systems, for adjusting the distance between two objects, preferably substrates or substrate holders, arranged one behind the other, wherein the device is suitable for carrying out the method described above.

By means of the device of the present disclosure, the front object is moved at a process speed $v_p$ in the transport system and with the rear object being at an undefined distance from the front object. This device comprises at least two successively arranged drive units preferably comprising a motor, a drive amplifier and an encoder, which each drive multiple drive elements, preferably rolls. The front drive unit is configured for adjusting the process speed $v_p$ for the front object, and the rear drive unit is configured for adjusting an initial speed $v_x > v_p$ for the rear object and for detecting the movement of a rear object against the front object on the basis of an increase in the driving torque.

The device can further comprise multiple position sensors which are suitable for detecting a first distance $a_1$, and the rear drive unit is further configured for adjusting a second speed $v_{x-m}$ after detecting the distance $a_1$, wherein $v_x > v_{x-m} > v_p$.

The rear drive unit can be configured for reducing, after detecting the increase in the driving torque, the speed by a predetermined value for a predetermined time in order to establish a predetermined distance $a_p$ from the front object.

Moreover, the rear drive unit can be configured for adjusting the process speed $v_p$ for the rear object after establishing the distance $a_p$.

Hence, the present disclosure provides a method by means of which, e.g., static objects or substrates can be caused to move such that they catch up with the already moving objects or substrates upstream of a possible coating source so as to be at a minimum, defined, small distance from them, so that they can pass the coating source in a pool.

The present disclosure starts out from the basic idea to configure the drive units such that the weight of the object in combination with the friction on the rolls and the related transmission ratio allow the detection of a small torque increase during a smooth catching up in the servo amplifier. Based on the torque increase, the positive locking of two objects is detected in a positionally accurate manner. It is thus possible to adjust a very small constant gap for the further movement.

By means of the present disclosure it can thus be prevented that an undefined or too large distance is caused when the objects move past a coating source. Moreover, it can be prevented that objects, or substrates, move against each other at a too large speed so that damage to the substrates can be caused.

DETAILED DESCRIPTION OF THE PREFERRED EMBODIMENT

In the following, the disclosure will be explained in more detail on the basis of preferred embodiments and the Figures.

Figure 1:
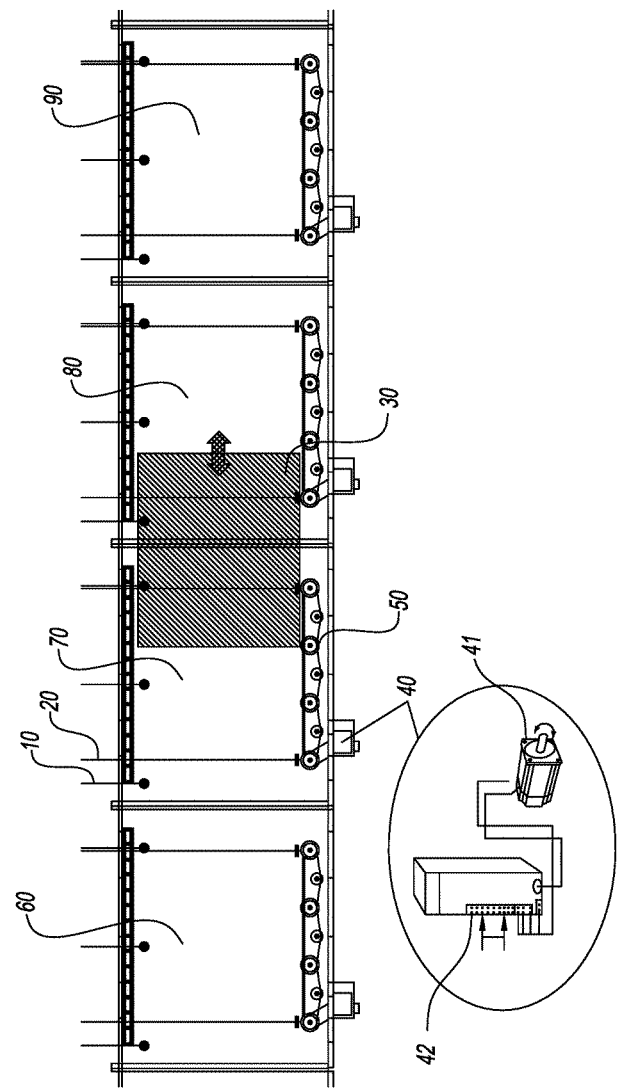
FIG. 1 schematically shows the basic structure of a solution of the disclosure.

A preferred embodiment of the disclosure is schematically shown in FIG. 1. FIG. 1 shows a total of four chambers 60, 70, 80, 90, an object 30, position sensors 10 (e.g. end switches), a drive unit 40 and drive elements 50.

The chambers 60, 70, 80, 90 are in direct contact with each other, but they can also be separated from each other by locks (e.g. in a vacuum system by vacuum locks). FIG. 1 exemplarily shows four chambers. However, it is clear that the number of chambers can be more than four and also less than four.

In accordance with this embodiment, each of the chambers 60, 70, 80, 90 comprises a drive unit 40. Each of the drive units preferably comprises a motor 41 with encoder and amplifier 42. The drive unit 40 is used for driving the drive elements 50 for being able to adjust the speed in the various chambers 60, 70, 80, 90 individually. Preferably, synchronization of the different drive elements 50 is realized by means of a motion controller system. Like the chambers 60, 70, 80, 90, also the drive units 40 can be present in any desired number. However, there must be at least two drive units 40 for being able to adjust at least two different speeds. The number of chambers 60, 70, 80, 90 can of course be different from the number of drive units 40.

The object 30 schematically shown in FIG. 1 is driven by the drive elements 50 in the movement direction through the different chambers 60, 70, 80, 90. In a transport system, or in a coating system, normally multiple objects are arranged one behind the other in different chambers 60, 70, 80, 90, as will be described further below.

Moreover, FIG. 1 shows an exemplary drive unit comprising a motor 41 with encoder and amplifier 42, wherein the amplifier is suitable for measuring an increase in the driving torque and outputting it as measuring signal. In accordance with the disclosure, an increase in the driving torque is caused by a rear object moving against a front object.

The position sensors 10 indicated in FIG. 1 are adapted for determining the position of the object. This position detection, however, is only suitable for determining a relatively rough position of the object in the transport system. The exactness substantially depends on the distance of the various position sensors 10.

The object 30 can have different shapes and dimensions. Some examples for objects can be a glass with/without carrier, a substrate made of any material with/without carrier, a glass inserted in a carrier, a substrate made of any material inserted in a carrier, a glass in a substrate frame, a substrate made of any material in a substrate frame, a closed box, a glass in a closed box, a substrate made of any material in a closed box, etc.

FIGS. 2(a) to 2(d) schematically show a flow chart of the preferred embodiment of the present disclosure for adjusting a distance in a transport system being as small as possible. The shown embodiment shows four moments M1 to M4 which refer to the moments of the drive elements. M1 to M4 are preferably servo drives which each drive the n rolls. The objects, or substrates (here exemplarily five substrates) are marked S1 to S5 and move one behind the other along a forward direction in the transport system.

Figure 2A:
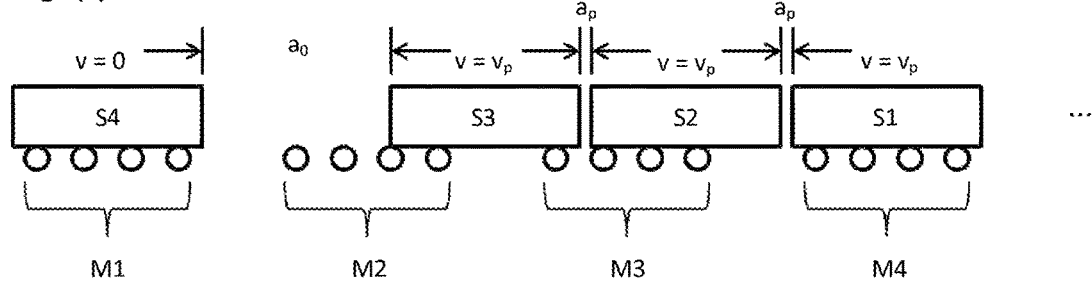
FIG. 2(a) shows a first step of a flow chart of a transport system in which a new substrate S4 to be processed is arranged in an initial state at the place of the drive unit.

In FIG. 2(a), the substrates S3 to S1 move at a distance $a_p$ and at a process speed $v_p$ through the transport system. A substrate S4 to be newly processed is arranged in an initial state at the place of the drive unit with the moment M1 at a speed v=0 m/s and an undefined distance $a_0$, wherein $a_0 > a_p$.

Figure 2B:
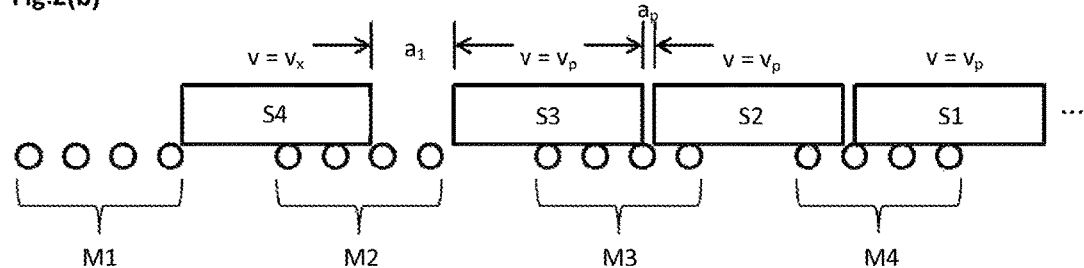
FIG. 2(b) shows a second step of the flow chart of FIG. 2(a) in which S4 is accelerated to an initial speed that is higher than a process speed of the other substrates in the transport system.
Figure 2C:
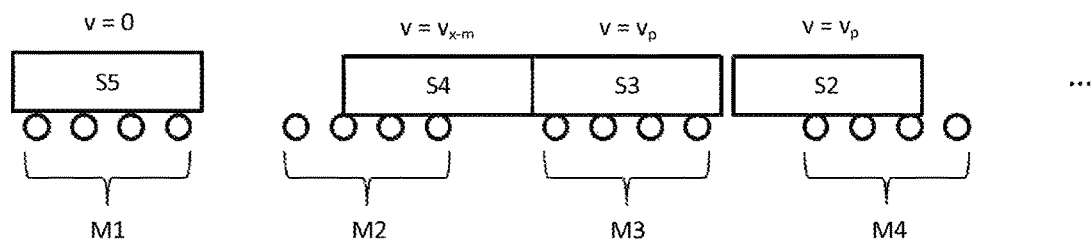
FIG. 2(c) shows a third step of the flow chart of FIGS. 2(a) and 2(b) in which the speed of S4 is reduced so that it can smoothly approach substrate S3 in the transport system.
Figure 2D:
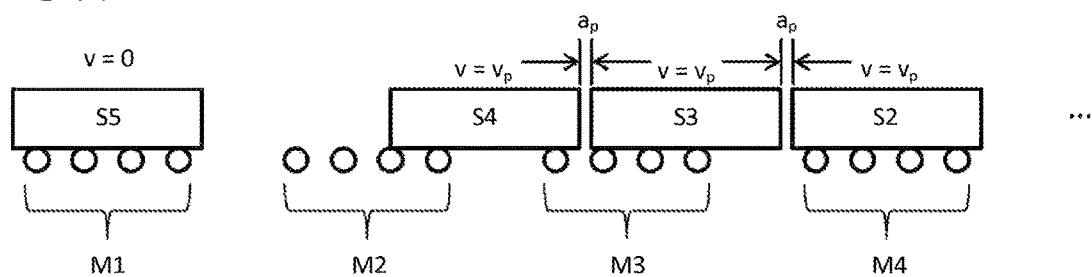
FIG. 2(d) shows a fourth step of the flow chart of FIGS. 2(a), 2(b), and 2(c) in which, after the distance between S4 and S3 is the same as the distance between S3 and S2, the speed of S4 is increased to achieve the processing speed of the other substrates.

According to FIG. 2(b), the substrate S4 is accelerated to an initial speed $v_x$, i.e. a defined starting moment is predetermined, wherein the speed $v_x$ is higher than the process speed $v_p$, so that the substrate S4 can catch up with the substrate S3. By means of position sensors 10 (FIG. 1), a first rough distance $a_1$ between the substrate S4 and the substrate S3 can be detected. The distance $a_1$ is preferably calculated by means of the position sensors 10 and a motion controller.

Then, the speed of the substrate S4 is reduced to $v_{x-m}$ in order to avoid a too hard approaching movement of substrate S4 against substrate S3. In order to nevertheless allow the substrate to further catch up with the substrate S3, the following must be true: $v_p < v_{x-m} < v_x$. Thus, a smooth movement of substrate S4 against substrate S3 is achieved (FIG. 2(c)). In particular in case of very sensitive substrates, a too fast (hard) approaching movement against the substrates can damage the substrates. Therefore, a smooth start is preferred. However, this step, as well as the detection of the first distance $a_1$ by the position sensors, can be omitted if the initial speed $v_x$ is sufficiently slow for avoiding a too hard approaching movement against the substrates or if non-sensitive substrates are used. The speeds $v_x$ and/or $v_{x-m}$ thus depend on the specific application and can be adjusted individually without leaving the basic idea of the disclosure.

Because the substrate S4 moves smoothly against the substrate S3, there is a small increase in the driving torque which can be measured by the amplifier 42. Once the amplifier detects an increase in the driving torque, the speed of the substrate S4 is adapted (delayed) so that it is reduced by a predetermined distance $a_p$ relative to the substrate S3. The substrate S4 is delayed in that the speed is reduced for a predetermined short time period to a speed lower than $v_p$. After the distance $a_p$ between the substrate S3 and the substrate S4 is established, the speed of substrate S4 is increased to $v_p$. Hence, substrates S3 and S4 move synchronously with a minimum distance $a_p$ further through the transport system (FIG. 2(d)) and the method can be repeated for the following substrate S5.

Figure 3:
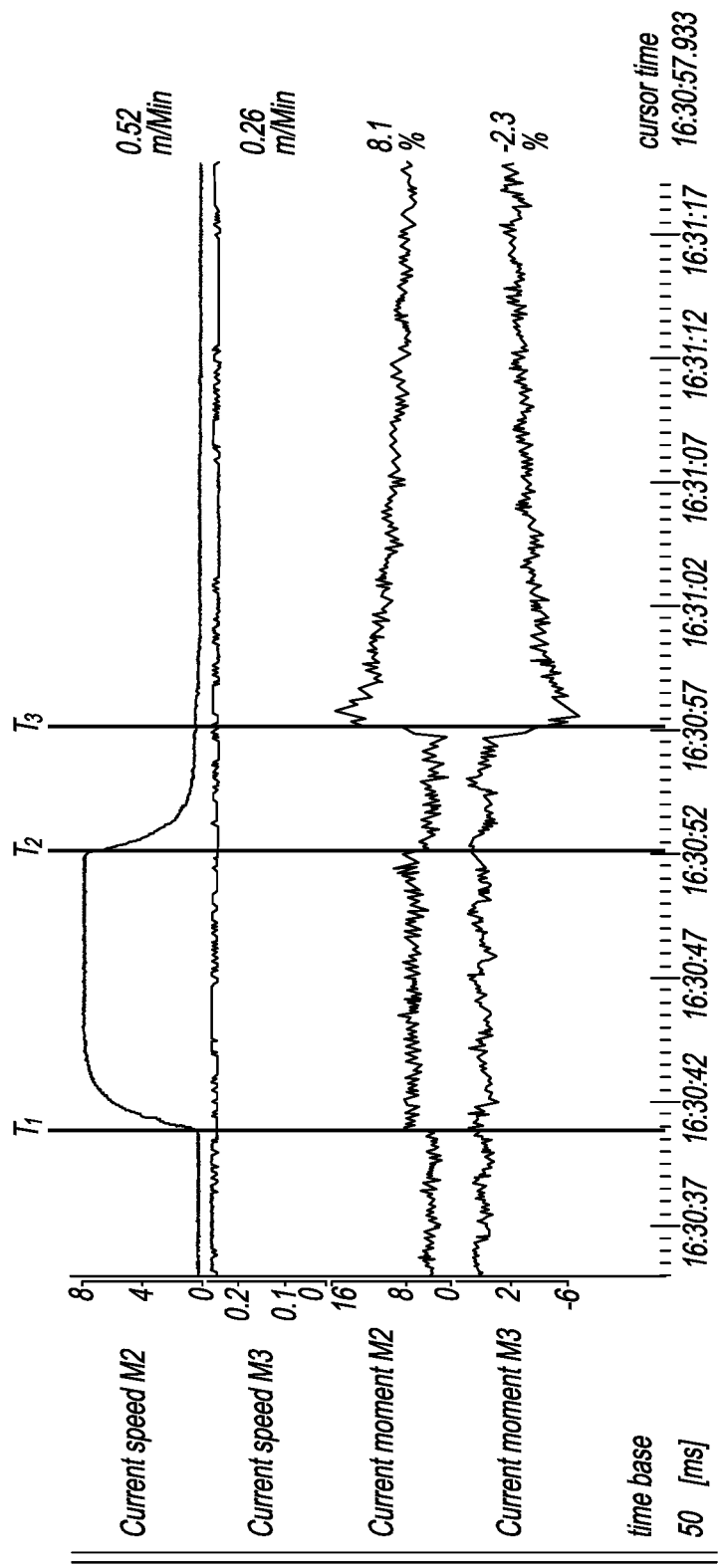
FIG. 3 shows measuring curves of the speeds and the moments of M2 and M3 of FIG. 2.

FIG. 3 shows several time-dependent measuring curves. The two measuring curves at the top describe the adjusted speeds for the drive units M2 (upper measuring curve) and M3 (lower measuring curve), wherein the lower one of the two measuring curves (speed of M3) corresponds to the constant process speed $v_p$. The upper measuring curve (speed of M2) starts at v=0 m/s and is increased from a first time point $t_1$ on to a first speed $v_x>0$ m/s. At the time point $t_2$, the speed of M2 is reduced to a second speed $v_{x-m}$. The time point $t_2$ is the time point at which the position sensors detect the first distance $a_1$ described above. Moreover, at the time point $t_3$, the speed of M2 is delayed for a short time such that the speed falls for a short time below the process speed $v_p$. This is not reflected in FIG. 3 because of the selected scale. In the further course, the speed of M2 is adjusted to the process speed $v_p$.

The two measuring curves at the bottom describe the measured temporal course of the moment (where the moment is defined as the torque $\tau=I\alpha$, where I is the moment of inertia and $\alpha$ is the angular acceleration) in view of M2 and M3. At the time point $T_1$, an increase in the moment in view of M2 is measured. Hence, this increase in the moment M2 correlates with the increase in the speed of M2. Accordingly, a moment decrease in M2 is detected at the time point $T_2$, i.e. at the time point of the speed reduction of M2. Finally, at the time point $T_3$, a moment increase in M2 or a moment decrease in M3 is detected, wherein the movement of the rear substrate against the front substrate can be detected and subsequently the speed can be adapted as described above in order to establish the desired distance between the two substrates.

Also if the moment increase in M2 has been described in the above-mentioned preferred embodiment for determining the movement of the rear substrate against the front substrate, FIG. 3 shows that also the moment decrease in M3 can be used for determining movement against a substrate.

The device and the method of the present disclosure can be used for different processes in different transport systems. The method is adapted to the different conditions of the different processes in the transport systems without leaving the present disclosure. For example, when using the method of the present disclosure in a tempering process, the device is subjected to particular thermal loads. In a sputtering or vapor deposition system, the device is subjected to contamination by the coating materials. In addition, some processes take place in a vacuum or even in a gaseous environment. In order to guarantee the stringing together of objects also under extreme conditions, the components of the device of the present disclosure must be adapted accordingly. In the exemplary embodiment described above, e.g., the position sensors could be adjusted to these environmental conditions and/or the motor unit with servo amplifier and encoder could be arranged at a place that is isolated from these disadvantageous environmental conditions. In accordance with the disclosure, the roll drives should be configured such that they remain movable.

Although the present disclosure has been described and shown with reference to its preferred embodiments, it is obvious to persons skilled in the art that various modifications and amendments can be made without leaving the scope of the disclosure. It is thus intended that the present disclosure covers the modifications and amendments of this disclosure as far as they are covered by the scope of protection of the attached claims and their equivalents.

What is claimed is:

1. A method for stringing together objects in a transport system and for adjusting an adjustable distance between two of the objects, wherein the two of the objects comprise a rear object arranged behind front object, wherein the front object moves at a speed in the transport system defined as a process speed $v_p$, and wherein the adjustable distance between the rear object and the front object is initially an undefined distance, the method comprising the following steps:
  (a) accelerating a speed of the rear object to an initial speed $v_x$, wherein $v_x>v_p$;
  (b) detecting a driving torque of at least one motor of the transport system;
  (c) detecting an increase in the driving torque when the rear object moves against the front object;
  (d) delaying the rear object by a predetermined value in order to establish that the adjustable distance between the front object and the rear object is a predetermined distance $a_p$; and
  (e) adjusting the speed of the rear object to correspond to the process speed $v_p$ of the front object.

2. The method according to claim 1, wherein after step (a) of accelerating the speed of the rear object to the initial speed $v_x$ and before step (c) of detecting the increase in the driving torque, additionally the following steps are carried out:
  (a1) detecting that the adjustable distance between the front object and the rear object is a first distance $a_1$; and
  (a2) reducing the speed of the rear object from the initial speed $v_x$ to a second speed $v_{x-m}$, wherein $v_x>v_{x-m}>v_p$.

3. The method according to claim 1, wherein the speed of the rear object and the speed of the front object are adjusted independently of one another by at least two successively arranged drive units, wherein each of the drive units comprises one of the at least one motors, a drive amplifier and an encoder, and wherein each drive unit drives multiple drive elements.

4. The method according to claim 3, wherein the at least two successively arranged drive units comprise a front drive unit that adjusts the speed of the front object and a rear drive unit that adjusts the speed of the rear object.

5. The method according to claim 2, wherein the first distance $a_1$ is detected by position sensors.

6. The method according to claim 1, wherein the increase in the driving torque when the rear object moves against the front object is determined by the at least one motor, wherein the at least one motor has a drive amplifier and an encoder.

7. The method according to claim 2, wherein the predetermined distance $a_p$ is smaller than the first distance $a_1$.

* * * * *